(12) United States Patent
Nakatani et al.

(10) Patent No.: US 6,732,415 B2
(45) Date of Patent: May 11, 2004

(54) FILM BULK ACOUSTIC RESONATOR AND METHOD OF MAKING THE SAME

(75) Inventors: Tadashi Nakatani, Kawasaki (JP); Tsutomu Miyashita, Kawasaki (JP); Yoshio Satoh, Kawasaki (JP)

(73) Assignees: Fujitsu Limited, Kawasaki (JP); Fujitsu Media Devices Limited, Nagano (JP)

( * ) Notice: Subject to any disclaimer, the term of this patent is extended or adjusted under 35 U.S.C. 154(b) by 1 day.

(21) Appl. No.: 09/984,418

(22) Filed: Oct. 30, 2001

(65) Prior Publication Data

US 2003/0015941 A1 Jan. 23, 2003

(30) Foreign Application Priority Data

Jul. 17, 2001 (JP) .......................... 2001-217177

(51) Int. Cl.[7] .............................................. H01L 41/08
(52) U.S. Cl. ...................................... 29/25.35; 310/324
(58) Field of Search ....................... 29/25.35; 310/324

(56) References Cited

U.S. PATENT DOCUMENTS 5,853,601 A * 12/1998 Krishaswamy et al. ........ 216/2
6,060,818 A * 5/2000 Ruby et al. .................. 310/363
6,081,171 A * 6/2000 Ella ............................ 333/189
6,355,498 B1 * 3/2002 Chan et al. ................... 438/48
6,377,137 B1 * 4/2002 Ruby .......................... 333/189
6,384,697 B1 * 5/2002 Ruby .......................... 333/189
6,424,237 B1 * 7/2002 Ruby et al. .................. 333/187
6,469,597 B2 * 10/2002 Ruby et al. .................. 333/187
6,483,229 B2 * 11/2002 Larson et al. ................ 310/348

FOREIGN PATENT DOCUMENTS

JP          06-204776        7/1994
JP          2000-69594       3/2000

* cited by examiner

Primary Examiner—Mark Budd
(74) Attorney, Agent, or Firm—Armstrong, Kratz, Quintos, Hanson & Brooks, LLP

(57) ABSTRACT

A film bulk acoustic resonator is fabricated in the following manner. First, a base layer is formed on an insulating substrate. Then, a resonator assembly is formed on the base layer. The resonator assembly includes a first electrode held in contact with the base layer, a second electrode, and a piezoelectric layer held between the first and the second electrodes. Then, a resist layer is formed to cover the resonator assembly and the base layer. Then, a through-hole is formed in the resist layer so that the base layer is exposed via the through-hole. Then, etchant is supplied via the through-hole to make a space in the base layer under the resonator assembly. Finally, the resist layer is removed.

16 Claims, 11 Drawing Sheets

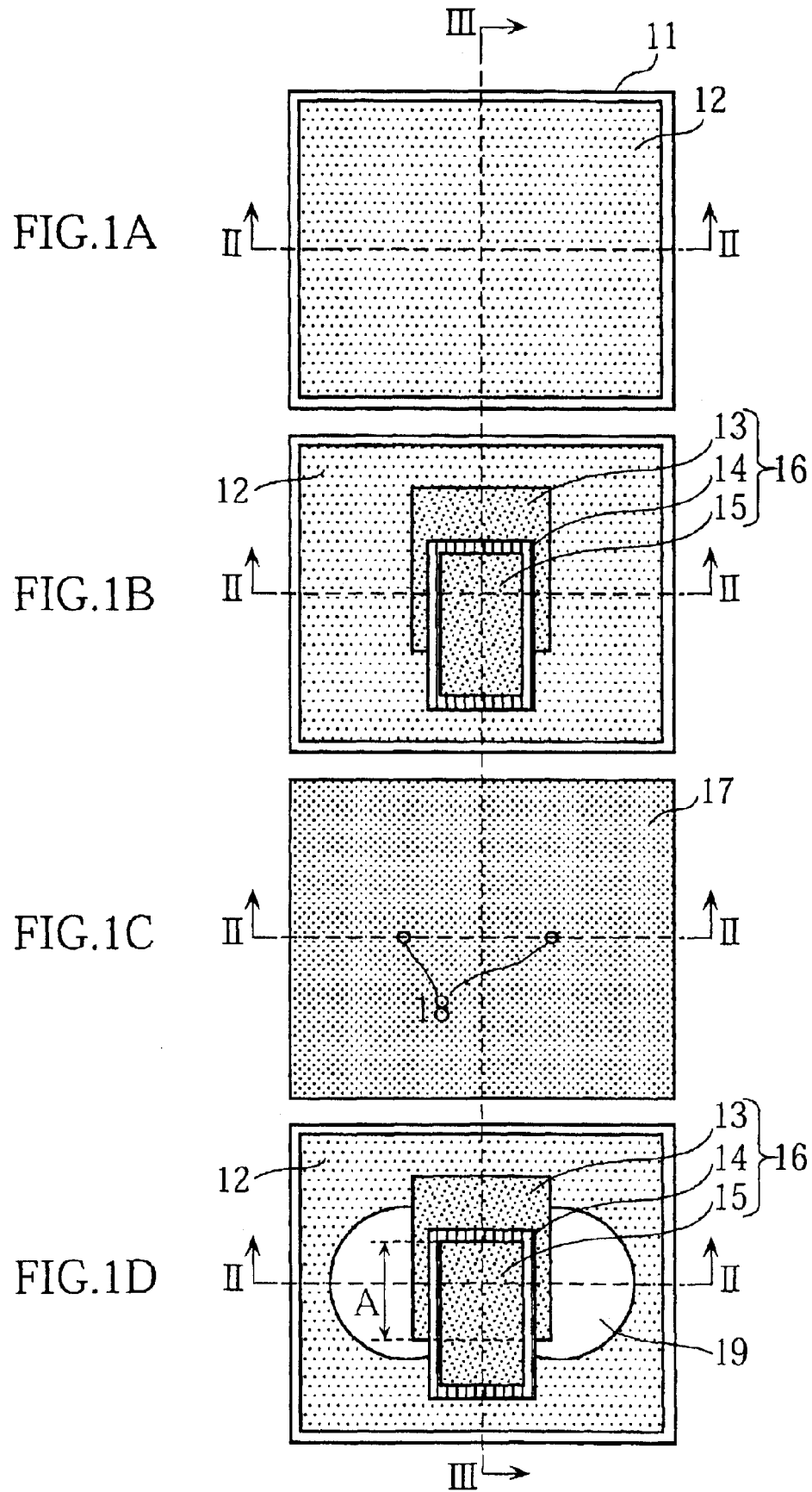

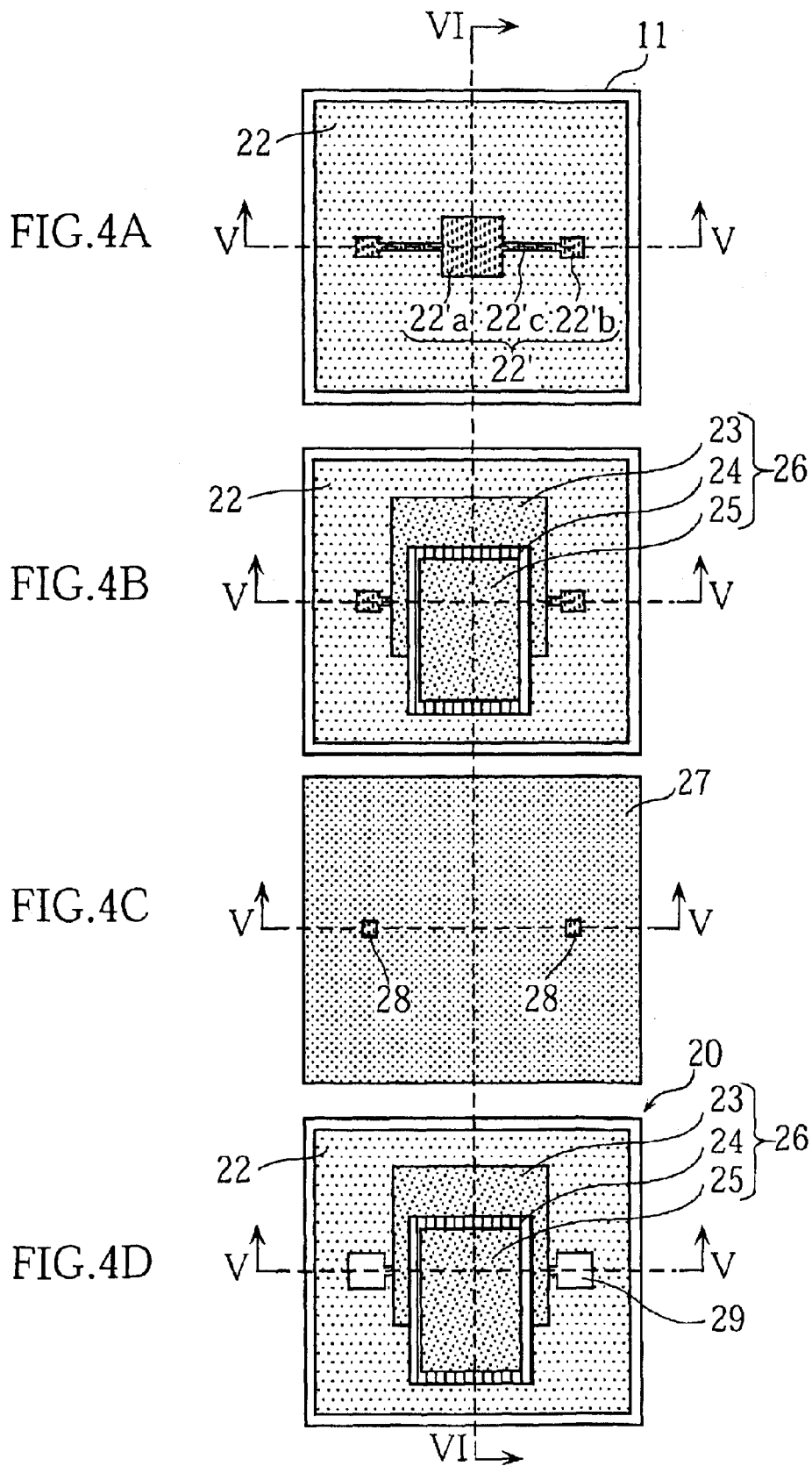

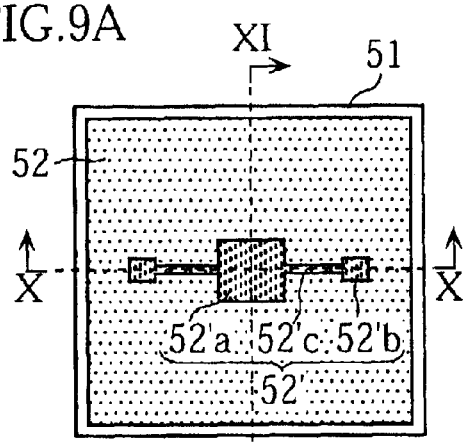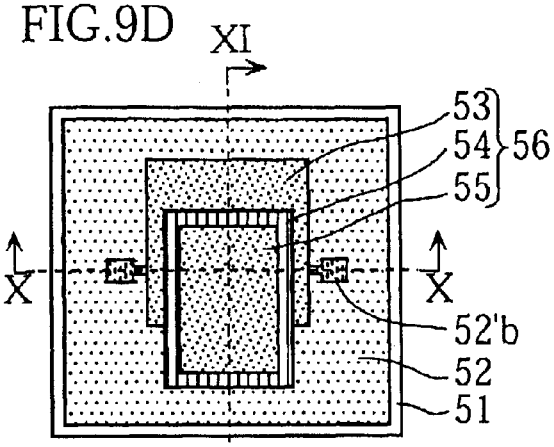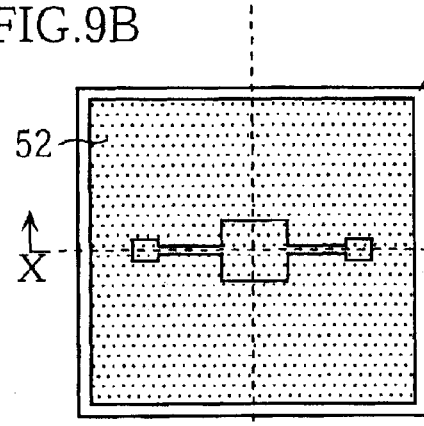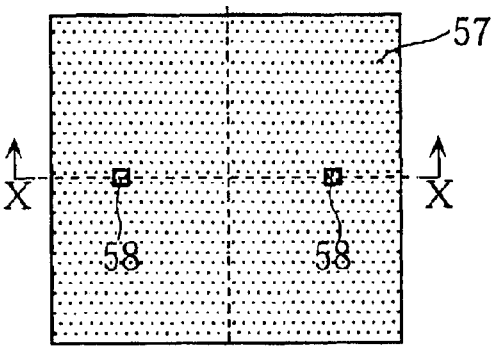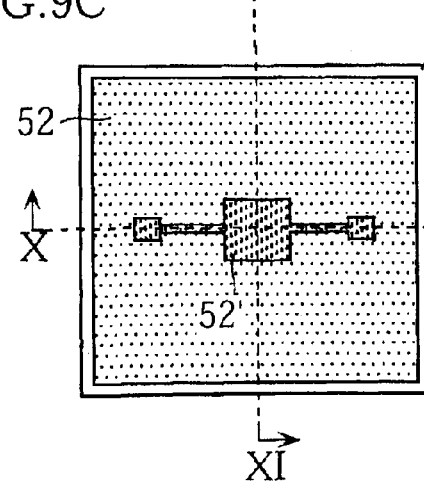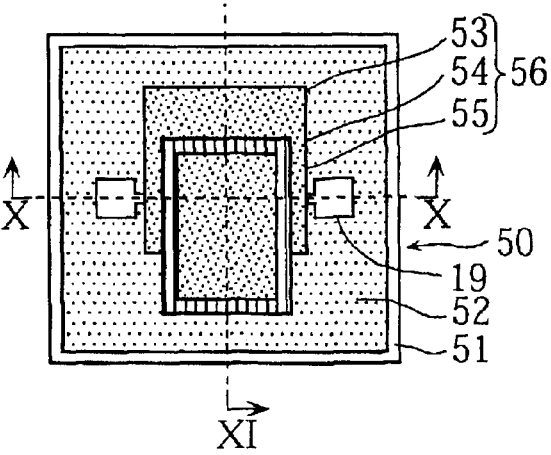

FILM BULK ACOUSTIC RESONATOR AND METHOD OF MAKING THE SAME

BACKGROUND OF THE INVENTION

1. Field of the Invention

The present invention relates to a film bulk acoustic resonator, and to a method of making the same.

2. Description of the Related Art

Portable telephones and other mobile telecommunications devices have spread far and wide during the past few years because of their handiness. This trend is still continuing, or even accelerating each time new models are put on the market. Accordingly, small wave filters used in these telecommunications devices are in great demand.

As is known, wave filters for portable telephones may be fabricated by utilizing surface acoustic wave ("SAW") elements. In general, a SAW filter exhibits sharp cut-off characteristics and can be made light and small. Thus, SAW filters are widely used as RF (radio frequency) filters or IF (intermediate frequency) filters in portable telephones.

Typically, a SAW filter includes a piezoelectric substrate and a comb-teeth electrode formed on the substrate. In accordance with the alternating voltage applied to the comb-teeth electrode, elastic waves corresponding to certain frequency bands are produced in the surface of the piezoelectric substrate. A problem of a SAW filter is that the comb-teeth electrode may be distorted, and even broken, due to the elastic waves resulting from the application of high voltage. This drawback becomes conspicuous as the comb-teeth electrode is smaller in width, that is, as the filter is designed to deal with higher frequencies.

A filter for high-voltage use maybe provided by utilizing film bulk acoustic resonators (referred to as "FBARs" hereinafter). An FBAR includes a substrate and a piezoelectric member held between upper and lower electrodes. The lower electrode is supported by the substrate, and this substrate is formed with a hollow portion under the lower electrode. When a voltage is applied between the upper and the lower electrodes, the piezoelectric member vibrates in its thickness direction, exhibiting its particular electric resonance characteristics. A band-pass-filter is constructed by arranging such FBARs in ladder form. The thus obtained FBAR filter is known to have excellent voltage-resistant properties. The hollow portion under the lower electrode improves the electromechanical coupling coefficient of the piezoelectric member, and widens the pass band of the filter.

Techniques to provide a hollow portion under a lower electrode are disclosed in JP-A-6(1994)-204776 and JP-A-2000-69594 for example. Specifically, JP-A-6-204776 teaches a hollow portion to be formed in a silicon wafer from below by anisotropic etching with the use of KOH solution. The hollow portion extends through the thickness of the wafer. On the other hand, JP-A-2000-69594 teaches using a sacrificial layer to fill in a recess formed in the surface of a substrate. More specifically, first, a recess is formed in the upper surface of the substrate. Then, a sacrificial layer is formed on the upper surface of the substrate in a manner such that part of the sacrificial layer is introduced into the recess. Thereafter, the sacrificial layer is removed by grinding, except for the recess-filling portion of the layer. Then, a lower electrode is formed on the substrate to cover the remnant of the sacrificial layer. Further, a piezoelectric member and an upper electrode are stacked on the lower electrode. Finally, the remnant of the sacrificial layer is removed, whereby a hollow portion appears under the lower electrode.

The above conventional techniques suffer from the following problems. Specifically, the silicon wafer of JP-A-6-204776 may be easily broken upon application of external force since the mechanical strength of the wafer is reduced by the hollow portion. Such fragility may require for extra care in dealing with the silicon wafer (e.g. in transporting the wafer from one working spot to another spot), and may lower the production yield rate. Another problem is caused by the etching process which renders the hollow portion to flare out in the downward direction. The inclination of the inner surface of the hollow portion may be about 55 degrees. With such a hollow portion varying in diameter in the thickness direction of the wafer, the respective resonators constructing a ladder-form filter tend to be unduly bulky. In the case of the technique disclosed in JP-A-2000-69594, several extra steps such as a recess-forming step, a sacrificial layer-forming step, a sacrificial layer-grinding step and a sacrificial layer-removing step are involved in the fabrication procedure. Thus, according to the teaching of JP-A-2000-69594, a resulting resonator is rather expensive due to the increased production costs.

In addition to the above-mentioned documents, JP-A-8 (1996)-148968 also discloses an FBAR provided with a hollow portion under the lower electrode. The piezoelectric member is made of ceramic. However, this document does not specifically show a method of making the hollow portion nor a method of making an FBAR.

SUMMARY OF THE INVENTION

The present invention has been proposed under the circumstances described above. It is, therefore, an object of the present invention is to provide an FBAR fabrication method and an FBAR itself that are capable of overcoming or at least alleviating the conventional problems. In particular, the present invention aims to provide an FBAR wherein an underlying hollow portion can be formed without relying on the time-consuming grinding of the sacrificial layer.

According to a first aspect of the present invention, there is provided a method of making a film bulk acoustic resonator. The method includes the steps of: forming a base layer on a substrate; forming a resonator assembly on the base layer, the resonator assembly including a first electrode, a second electrode and a piezoelectric layer held between the first and the second electrodes, the first electrode being held in contact with the base layer; forming a resist layer that covers the resonator assembly and the base layer; forming a through-hole in the resist layer for partially exposing the base layer; forming a space in the base layer under the resonator assembly by etchant supplied via the through-hole; and removing the resist layer.

Preferably, the base layer has a thickness greater than a depth of the space.

According to a second aspect of the present invention, there is provided a method of making a film bulk acoustic resonator. The method includes the steps of: forming a base layer on a substrate; patterning a sacrificial layer on the base layer; forming a resonator assembly which includes a first electrode, a second electrode and a piezoelectric layer disposed between the first and the second electrodes, the first electrode being held in contact with the sacrificial layer and the base layer; forming a resist layer covering the resonator assembly, the sacrificial layer and the base layer; forming a through-hole in the resist layer for exposing a portion of the sacrificial layer; supplying first etchant via the through-hole for removing the sacrificial layer so as to provide a preliminary space under the resonator assembly; supplying second etchant via the through-hole for making a main space in the base layer under the resonator assembly, the main space being larger than the preliminary space; and removing the resist layer.

Preferably, the step of forming the through-hole includes exposing a portion of the first electrode via the through-hole and removing the exposed portion of the first electrode to expose the sacrificial layer.

Preferably, the method further includes the step of forming an additional layer on the base layer after the sacrificial layer is formed, wherein the additional layer is made to be flush with the sacrificial layer.

Preferably, the sacrificial layer includes a first land, a second land and a connection strip connecting the first land to the second land, wherein the resonator assembly is formed to cover the first land, and the through-hole is formed to expose at least a portion of the second land.

Preferably, the sacrificial layer is smaller in thickness than the first electrode.

Preferably, the base layer has a thickness greater than a depth of the main space.

Preferably, the base layer has a thickness in a range of 1–50 $\mu$m.

Preferably, base layer is made of an insulating material.

Preferably, the sacrificial layer is made of magnesium oxide or zinc oxide.

According to a third aspect of the present invention, there is provided a film bulk acoustic resonator including: a support; a resonator assembly provided on the support, the assembly including a lower electrode, an upper electrode and a piezoelectric member disposed between the upper and the lower electrodes; a first space located between the lower electrode and the support; and a second space communicating with the first space, wherein the second space is larger than the first space.

According to a fourth aspect of the present invention, there is provided a film bulk acoustic resonator including: a substrate; a base layer formed on the substrate; a resonator assembly including a first electrode, a second electrode and a piezoelectric layer disposed between the first and the second electrodes, the first electrode being held in contact with the base layer; and a space in the base layer under the resonator assembly, wherein the first electrode includes a recess facing the space.

Other features and advantages of the present invention will become apparent from the detailed description given below with reference to the accompanying drawings.

BRIEF DESCRIPTION OF THE DRAWINGS

FIGS. 1A–1D are plan views illustrating a fabrication method according to a first embodiment of the present invention;

FIGS. 4A–4D are plan views illustrating a fabrication method according to a second embodiment of the present invention;

FIGS. 9A–9F are plan views illustrating a fabrication method according to a fifth embodiment of the present invention;

DETAILED DESCRIPTION OF THE PREFERRED EMBODIMENTS

The preferred embodiments of the present invention will be described below with reference to the accompanying drawings.

Reference is first made to FIGS. 1A–1D, 2A–2F and 3A–3F to describe an FBAR (Film Bulk Acoustic Resonator) fabrication method according to a first embodiment of the present invention. As noted above, FIG. 1 are plan views, FIG. 2 are sectional views taken along lines II—II in FIG. 1, and FIG. 3 are sectional views taken along lines III—III in FIG. 1.

Figure 2A:
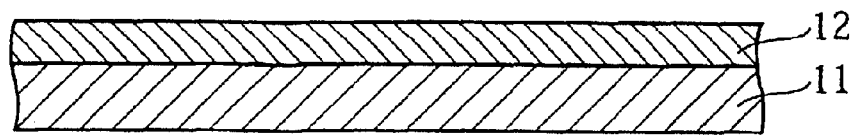
FIGS. 2A–2F are sectional views taken along lines II—II in FIG. 1.
Figure 3A:
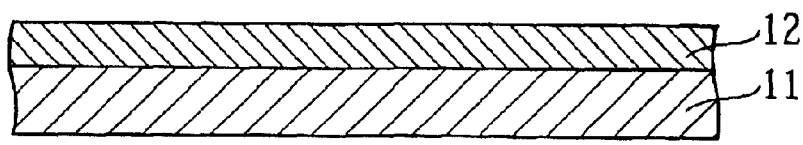
FIGS. 3A–3F are sectional views taken along lines III—III in FIG. 1.

In accordance with the method, first, a base layer 12 is formed on a silicon substrate 11, as shown in FIGS. 1A, 2A and 3A. The base layer 12 has a thickness of 5 $\mu$m and is made of an insulating material such as magnesium oxide using a known sputtering for example. Of course, the present invention is not limited to this. For instance, the thickness of the base layer 12 may be varied in a range of 1–50 $\mu$m. The insulating material, other than magnesium oxide, may be silicon dioxide, zinc oxide, PSG (phosphorus-added silicon glass), BSG (boron-added silicon glass), BPSG (boron, phosphorus-added silicon glass), or SOG (spin-on glass).

Figure 2B:
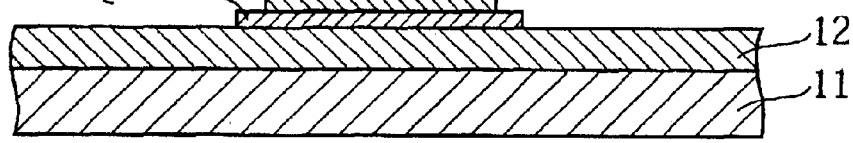
Figure 3B:
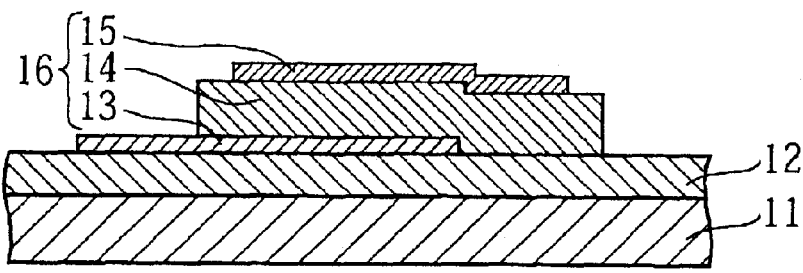

Then, as shown in FIGS. 1B, 2B and 3B, a resonator assembly 16 consisting of three layers 13–15 is made on the base layer 12. Number 13 refers to a first electrode, number 14 refers to a piezoelectric layer, and number 15 refers to a second electrode.

The first electrode 13 is made of molybdenum and has a thickness of 100 nm. The first electrode 13 may be made in the following manner. First, a molybdenum layer is formed on the base layer 12 to have a desired thickness. Then, the molybdenum layer is processed into the prescribed configuration by photolithography and (dry or wet) etching. A usable dry etching technique may be RIE. For wet etching, ammonium cerium (IV) nitrate may be used as etchant.

Then, the piezoelectric layer 14 and the second electrode 15 may be formed in the following manner. First, an aluminum nitride layer (which will become the piezoelectric layer 14) having a thickness of 500 nm is formed by sputtering for example. According to the present invention, zinc oxide may be used in place of the aluminum nitride. Then, a molybdenum layer having a thickness of 100 nm is formed on the aluminum nitride layer by sputtering for example. Then, as in the case of the first electrode 13, the upper molybdenum layer is processed into the prescribed configuration, to provide the second electrode 15. Then, the intermediate aluminum nitride layer is processed by photolithography and wet etching, to provide the piezoelectric layer 14. For this wet etching, heated phosphoric acid may be used as etchant. However, when the piezoelectric layer 14 is made of zinc oxide, acetic acid may be used for the etchant.

According to the present invention, the first and/or the second electrodes may be made of tantalum, tungsten, nickel, niobium, gold, platinum, copper, palladium, aluminum, titanium, chromium, titanium nitride, tantalum nitride, niobium nitride, molybdenum silicide, tantalum silicide, tungsten silicide, niobium silicide, or chromium silicide.

Figure 2C:
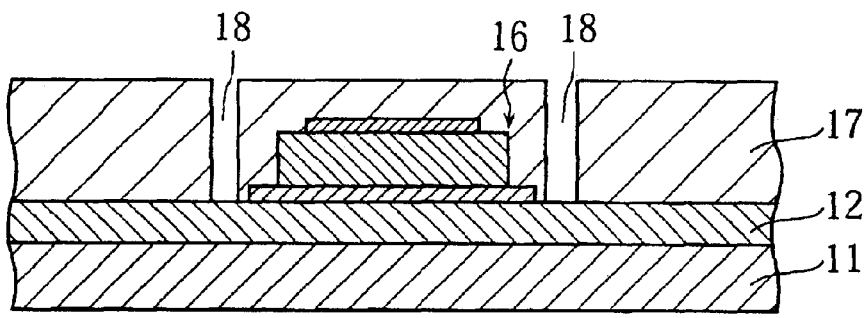
Figure 2D:
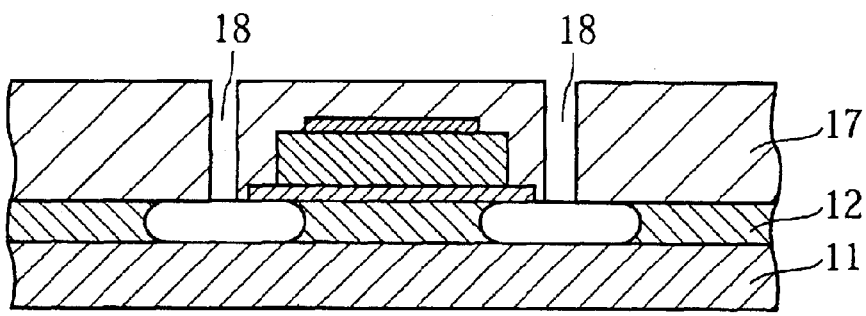
Figure 2E:
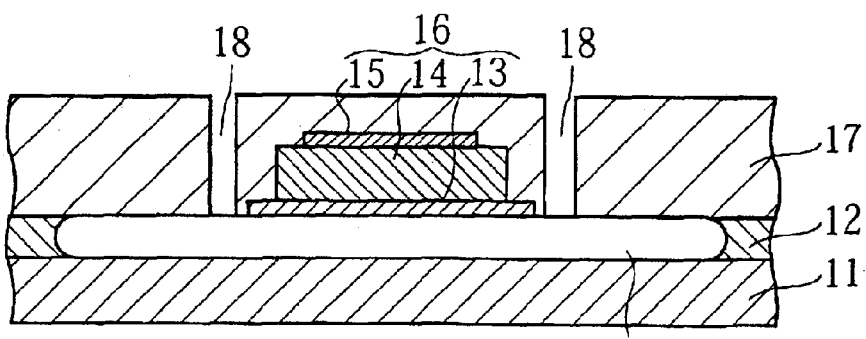
Figure 3C:
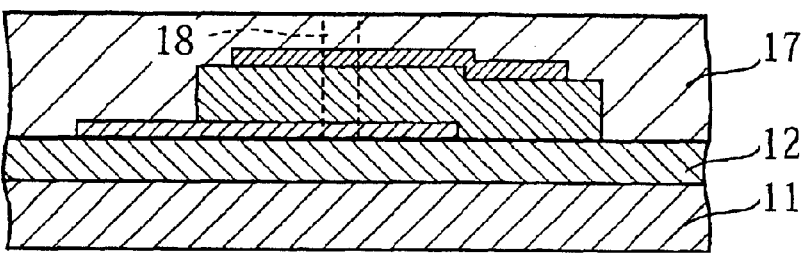
Figure 3D:
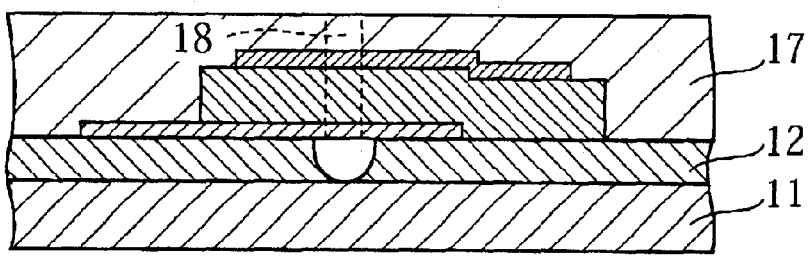
Figure 3E:
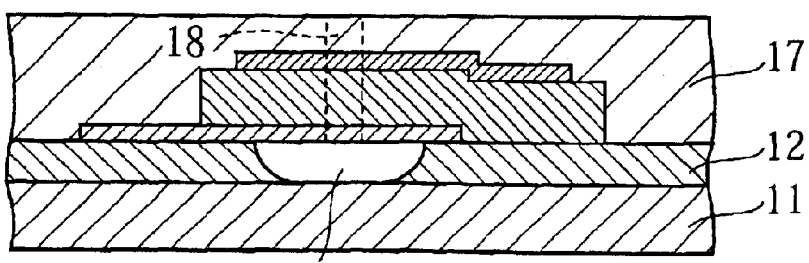

Referring now to FIGS. 1C, 2C and 3C, a photoresist 17 is formed to cover the base layer 12 and the resonator assembly 16 after the resonator assembly 16 has been fabricated. As shown in the figures, the photoresist 17 is formed with through-holes 18 through which the base layer 12 is exposed. Such holes may be made by photolithography. The photoresist 17 may be a novolak-based, positive-tone resist. In the illustrated embodiment, two through-holes 18 are formed adjacent to the first electrode 13 in a flanking manner. Then, the substrate-layer assembly (11, 12, 16, 17) shown in FIG. 2C is immersed in an acetic acid solution acting as the etchant for the base layer 12 (made of magnesium oxide). Thus, the acetic acid solution will flow into the through-holes 18 formed in the photoresist 17. Consequently, as shown in FIGS. 2D and 3D, the base layer 12 is uniformly etched away about the lower ends of the respective through-holes 18. The two hollow portions in the base layer 12 become greater in diameter (as seen in plan view) as the etchant flows in more via the through-holes 18. Finally, the follow portions will merge into one large space 19, as shown in FIGS. 2E and 3E. At this stage, the substrate-layer assembly is taken out of the etchant to stop the growth of the space 19.

Figure 2F:
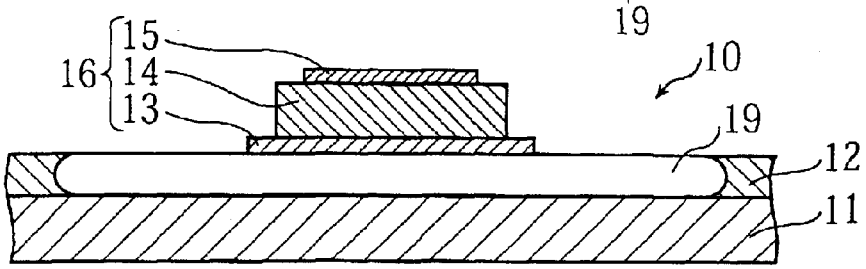
Figure 3F:
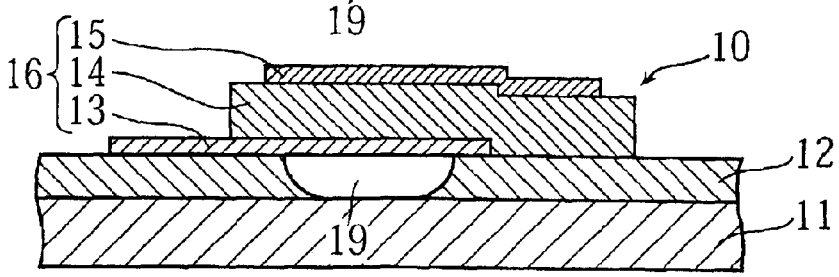

Finally, as shown in FIGS. 1D, 2F and 3F, the photoresist 17 is removed, whereby a product film bulk acoustic resonator 10 is obtained. As seen from the above, the resonator 10 is provided with a space 19 under the first electrode 13. The depth of the space 19 is 5 $\mu$m.

As known in the art, a band-pass-filter is obtained by connecting a plurality of resonators 10 in ladder form. Referring to FIG. 1D, the overlapping length A of the first and the second electrodes 13, 14 is one parameter to specify the characteristics of the resulting filter. For instance, when the length A is set at 40 $\mu$m for the resonators connected in series and at 100 $\mu$m for the resonators connected in parallel, the ladder structure of the resonators may provide a band-pass filter having a central frequency of 5 GHz.

Reference is now made to FIGS. 4A–4D, 5A–5F and 6A–6F to describe an FBAR fabrication method according to a second embodiment of the present invention. Of these figures, FIG. 4 are plan views, FIG. 5 are sectional views taken along lines V—V in FIG. 4, and FIG. 6 are sectional views taken along lines VI—VI in FIG. 4.

Figure 5A:
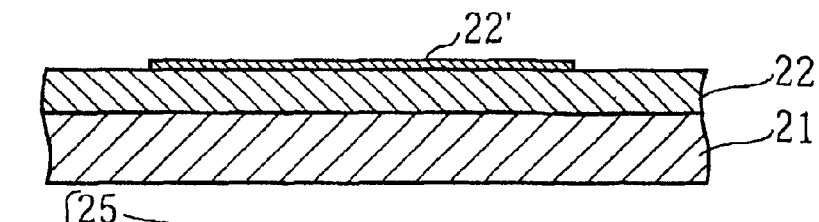
FIGS. 5A–5F are sectional views taken along lines V—V in FIG. 4.
Figure 6A:
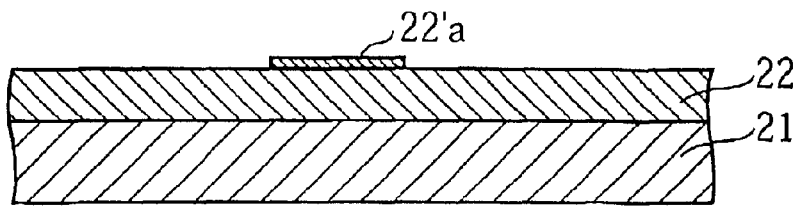
FIGS. 6A–6F are sectional views taken along lines VI—VI in FIG. 4.

In accordance with the second embodiment, an FBAR is fabricated in the following manner. First, as shown in FIGS. 4A, 5A and 6A, a base layer 22 and a sacrificial layer 22' are formed on a silicon substrate 21. Specifically, the base layer 22 may be made of silicon dioxide by plasma CVD (chemical vapor deposition) to have a thickness of 5 $\mu$m. Then, a magnesium oxide layer having a thickness of 10 nm is made on the base layer 22 by electron beam deposition for example. This MgO layer is processed into the sacrificial layer 22' by photolithography and wet etching (or dry etching). For wet etching, the etchant may be acetic acid solution. In the illustrated embodiment, the sacrificial layer 22' includes a first island 22'a and two second islands 22'b. The second islands 22'b are opposite to each other with respect to the first island 22'a and are linked to the first island 22'a via connection strips 22'c. The sacrificial layer 22' may be made of zinc oxide, so that it has a greater etching selectivity (i.e. more easily etched away) than the base layer 22 and a first electrode 23 (to be described later).

Figure 5B:
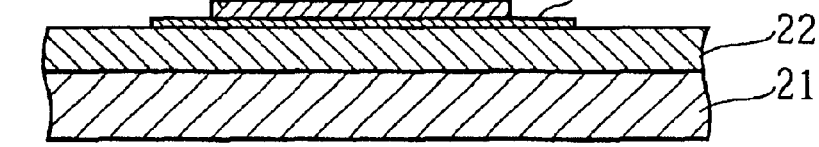
Figure 6B:
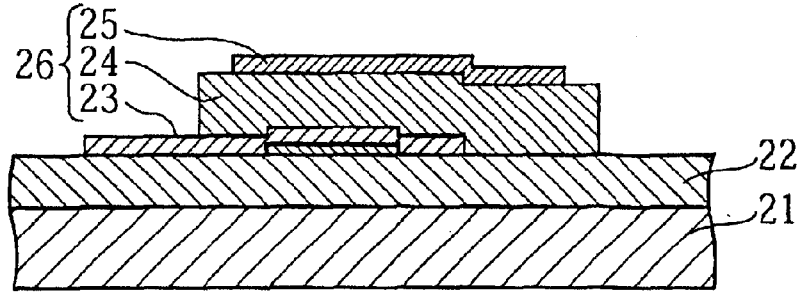

Then, as shown in FIGS. 4B, 5B and 6B, a resonator assembly 26 is formed on the base layer 22. The resonator assembly 26 consists of a first electrode 23, a piezoelectric layer 24 and a second electrode 25. Specifically, first, a molybdenum layer having a thickness of 100 nm is formed on the base layer 22 by sputtering for example. Then, the molybdenum layer is processed into the first electrode 23 by photolithography and dry etching (or wet etching) in a manner such that the resulting first electrode 23 covers the first island 22'a and a part of each connection strip 22'c of the sacrificial layer 22'. Due to the presence of the sacrificial layer 22', the first electrode 23 is not entirely flat, but has a partially raised portion. (As viewed on the lower side, the first electrode 23 is formed with a recess.) The height difference between the raised portion and the remaining portion of the first electrode 23 is 10 nm.

After the first electrode 23 has been made, an aluminum nitrate layer having a thickness of 500 nm is formed on the first electrode 23 by sputtering. Then, upon this aluminum nitrate layer, a molybdenum layer having a thickness of 100 nm is made by sputtering. Thereafter, the upper molybdenum layer is processed into a predetermined configuration by photolithography and dry (or wet) etching. Thus, the second electrode 25 is obtained. Then, the lower aluminum nitrate layer is processed into a predetermined configuration by photolithography and wet etching, whereby the piezoelectric layer 24 is obtained between the first (lower) electrode 23 and the second (upper) electrode 25.

Figure 5C:
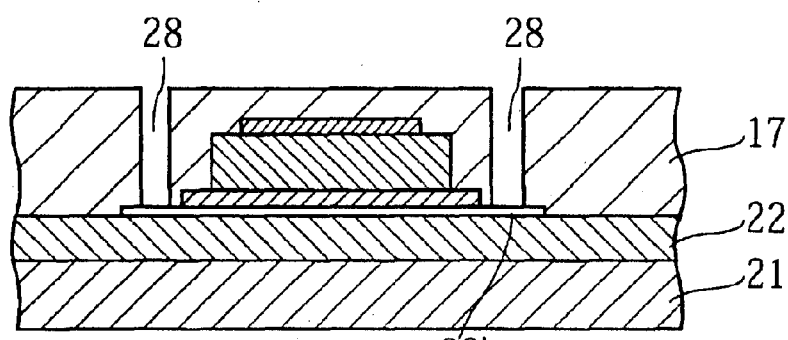
Figure 6C:
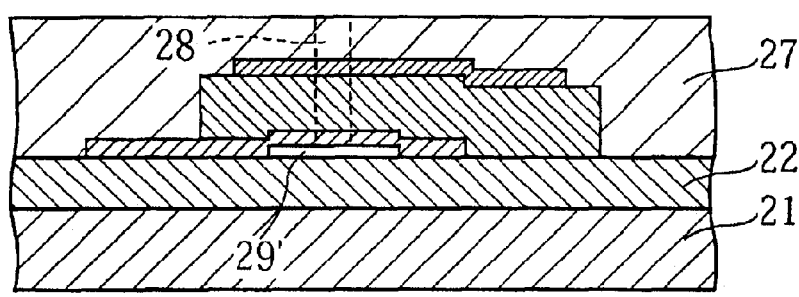

Then, as shown in FIGS. 4C, 5C and 6C, a photoresist 27 is formed on the substrate 11 to cover the base layer 22 and the resonator assembly 26. Then, through-holes 28 are made in the photoresist 27 by photolithography to expose the upper surfaces of the respective second islands 22'b of the sacrificial layer 22'. Then, the substrate-layer assembly (21, 22, 26, 27) is immersed in acetic acid solution acting as the etchant for the sacrificial layer 22' (made of magnesium oxide). Upon this, the acetic acid solution will flow into the through-holes 28 in the photoresist 27 and reach the sacrificial layer 22'. Consequently, the etchant etches away the sacrificial layer 22', thereby making a preliminary space 29' under the resonator assembly 26. It should be noted here that the base layer 22 (made of silicon dioxide) remains substantially intact even in the presence of the acetic acid solution.

Figure 5D:
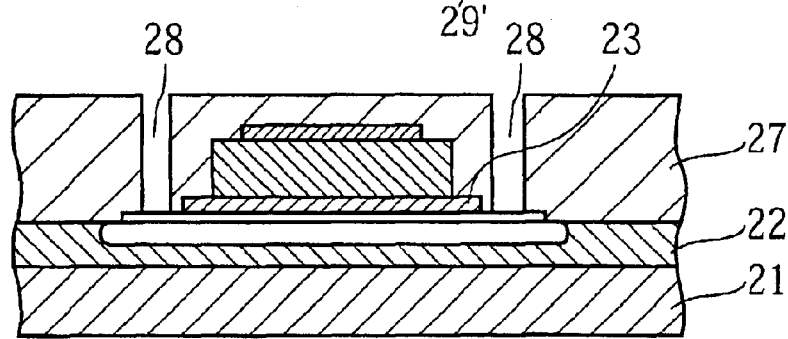
Figure 5E:
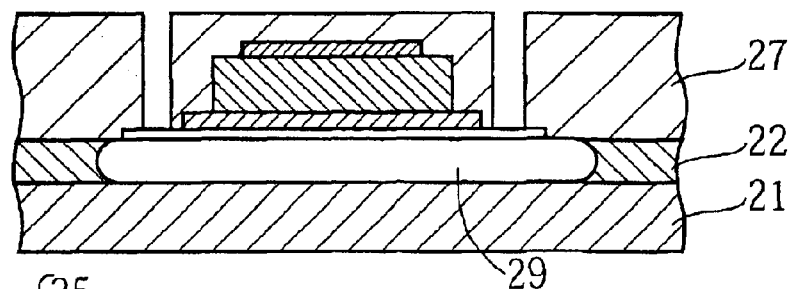
Figure 6D:
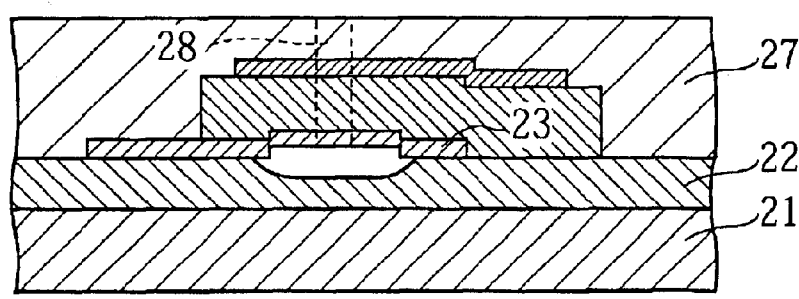
Figure 6E:
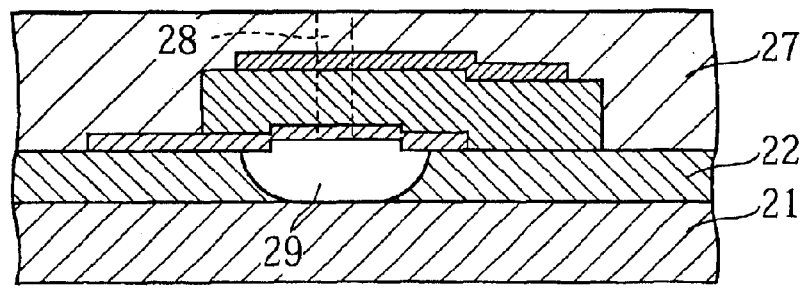

After the preliminary space 29' is formed, the substrate-layer assembly is immersed in hydrofluoric acid buffer solution acting as the etchant for the base layer 22. Upon this, the etchant flows into the through-holes 28 and the preliminary space 29'. Thereafter, as shown in FIGS. 5D and 6D, the etching uniformly proceeds downward through the thickness of the base layer 22, while also proceeding laterally at the same rate. The etching process is stopped when the entire thickness (5 $\mu$m) of the base layer 22 is eaten away, as shown in FIGS. 5E and 6E. As viewed in plan, the resulting space 29 has become larger than the preliminary space 29' by 5 $\mu$m. Since the lateral growth of the main space 29 is thus small relative to the preliminary space 29', the FBAR of the present invention can be advantageously small.

Figure 5F:
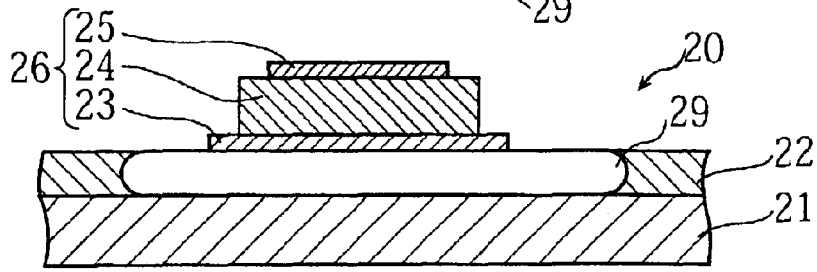
Figure 6F:
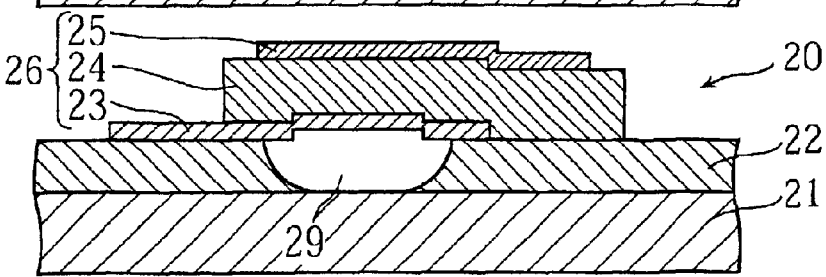

After the formation of the main space 29, the photoresist 27 is removed, as shown in FIGS. 4D, 5F and 6F. Thus, a product FBAR 20 is obtained. A band-pass-filter may be fabricated by arranging a suitable number of FBARs 20 in ladder form.

As described above, the etchant is introduced into the preliminary space 29', and then eats away a portion of the base layer 22 to provide the main space 29. The preliminary space 29' is configured by the sacrificial layer 22'. In this manner, the configuration of the main space 29 can be tailored by changing the geometry of the sacrificial layer 22'. This is advantageous to adjusting the characteristics of the filter. In FIG. 4A, the sacrificial layer 22' is depicted as "two-armed", though the present invention is not limited to this. The sacrificial layer 22' may have only one pair of second island 22'b and connection strip 22'c or more than two pairs.

Figure 7:
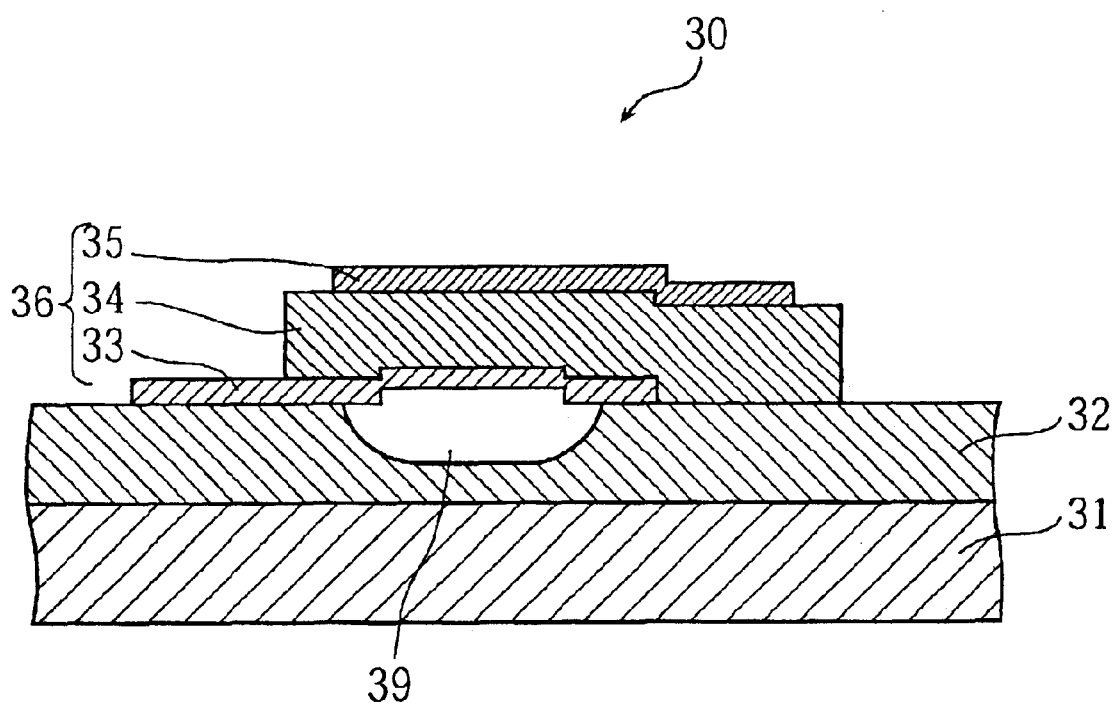
FIG. 7 is a sectional view showing a film bulk acoustic resonator produced by a fabrication method according to a third embodiment of the present invention.

FIG. 7 shows, in section, an FBAR 30 obtained by a fabrication method according to a third embodiment of the present invention. As seen from the comparison between FIG. 7 and FIG. 6F, the FBAR 30 is substantially the same as the FBAR 20 of the second embodiment except for some differences described below.

Specifically, the FBAR 30 includes a silicon substrate 31, a base layer 32 and a resonator assembly 36. Again, the resonator assembly 36 is a three-component device consisting of a first electrode 33, a piezoelectric layer 34 and a second electrode 35. The base layer 32 is formed with a space 39 situated under the resonator assembly 36. In the third embodiment, the base layer 32 has a thickness of 10 µm, which differs from the counterpart thickness of the second embodiment (i.e. 5 µm). Since the depth of the space 39 is 5 µm, the space 39 does not extend through the base layer 32, but stops short of the substrate 31. This arrangement ensures a wide contact surface between the substrate 31 and the base layer 32, which is advantageous to achieving the stable fixing of the base layer 32 to the substrate 31.

Figure 8:
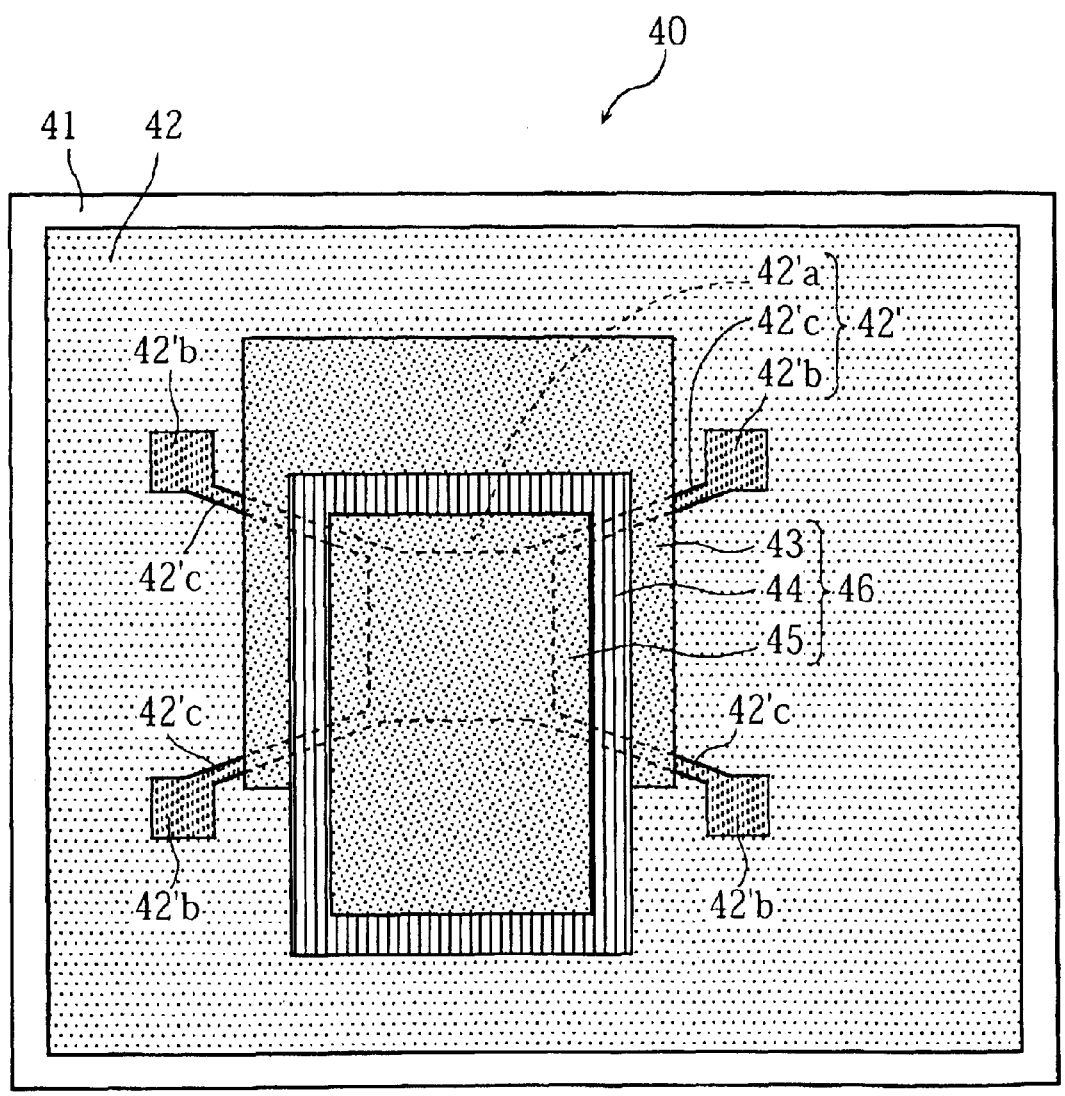
FIG. 8 is a plan view showing a film bulk acoustic resonator produced by a fabrication method according to a fourth embodiment of the present invention.

FIG. 8 shows one step of an FBAR fabrication method according to a fourth embodiment of the present invention. The illustrated step corresponds to the step shown in FIG. 4B (relating to the second embodiment). As illustrated, an FBAR 40 of the fourth embodiment includes a silicon substrate 41, a base layer 42, a sacrificial layer 42' and a resonator assembly 46. The resonator assembly 46 consists of a first electrode 43, a piezoelectric layer 44 and a second electrode 45.

In this embodiment, the sacrificial layer 42' includes a first island 42'a disposed under the resonator assembly 46, four second islands 42'b spaced from the first island 42'a, and four connection strips 42'c for connecting the respective second islands 42'b to the first island 42'a. The other members, elements, etc. are similar in arrangement to the counterparts described above with respect to the second embodiment.

After the resonator assembly 46 has been prepared on the substrate 41, a photoresist (not shown) is formed to enclose the base layer 42 and the resonator assembly 46 in the same manner as shown in FIG. 5C. According to the fourth embodiment, the non-illustrated photoresist is provided with four through-holes each of which corresponds in position to a relevant one of the four second islands 42'b. As in the previous embodiments, etchant for the sacrificial layer 42' (that is, acetic acid solution) is supplied via the through-holes, so that a preliminary space (cf. reference number 29' in FIG. 5C) is formed under the resonator assembly 46. Then, etchant for the base layer 42 (that is, hydrofluoric acid buffer solution) is supplied into the preliminary space via the through-holes, so that a main space is formed in the base layer 42. In the fourth embodiment, use is made of four through-holes to supply the etchants to the sacrificial layer 42' and the base layer 42. This is advantageous to cutting down the etching time.

FIGS. 9A–9F show the steps of an FBAR fabrication method according to a fifth embodiment of the present invention. FIGS. 10A–10F are sectional views taken along lines X—X in FIGS. 9A–9F, while FIGS. 11A–11F are sectional views taken along lines XI—XI in FIGS. 9A–9F.

Figure 10A:
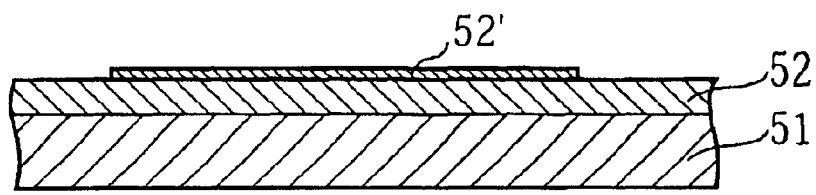
FIGS. 10A–10F are sectional views taken along lines X—X in FIG. 9.
Figure 11A:
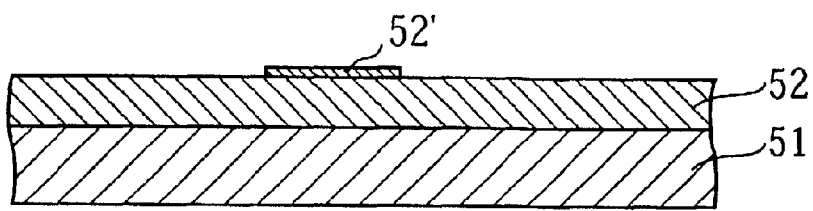
FIGS. 11A–11F are sectional views taken along lines XI—XI in FIG. 9.

In accordance with the fifth embodiment, a base layer 52 and a sacrificial layer 52' are formed on a silicon substrate 51, as shown in FIGS. 9A, 10A and 11A. Specifically, the base layer 52 is formed by providing a 5 µm-thick silicon oxide layer on the silicon substrate 51 by plasma CVD for example. Then, a 10 µm-thick magnesium oxide layer is formed on the base layer 52. Thereafter, the magnesium oxide layer is processed into the desired sacrificial layer 52' by photolithography and wet (or dry) etching. For wet etching, the etchant may be acetic acid solution. In this embodiment, the sacrificial layer 52' includes one first island 52'a and two second islands 52'b connected to the first island by connection strips 52'c. The sacrificial layer 52' maybe made of zinc oxide, so that it has a greater etching selectivity than the base layer 52 and a first electrode 53 (to be described later).

Figure 10B:
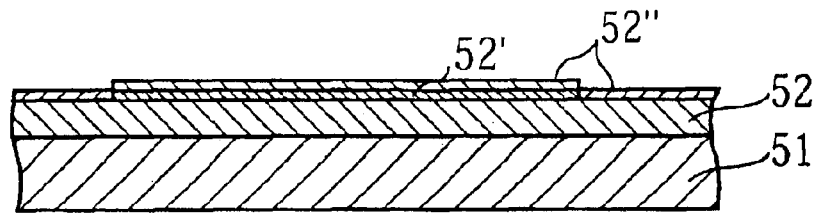
Figure 11B:
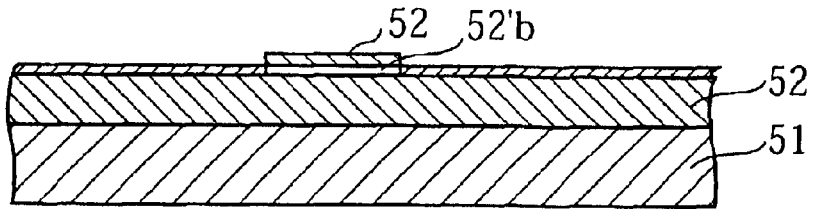

Then, as shown in FIGS. 9B, 10B and 11B, a 10 µm-thick silicon oxide layer 52'' is formed on the base layer 52 and the sacrificial layer 52' by plasma CVD for example. Note that the thickness of the silicon oxide layer 52'' is the same as that of the sacrificial layer 52'.

Figure 10C:
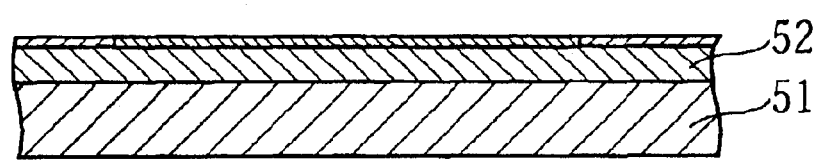
Figure 11C:
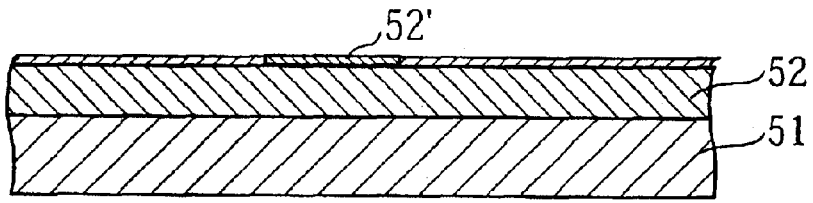

Then, as shown in FIGS. 9C, 10C and 11C, the silicon oxide layer 52'' is rendered flush with the sacrificial layer 52' by removing the raised portion of the silicon oxide layer 52'' that is disposed on the sacrificial layer 5'. This removal maybe achieved by an etch back method with the use of a resist.

Figure 10D:
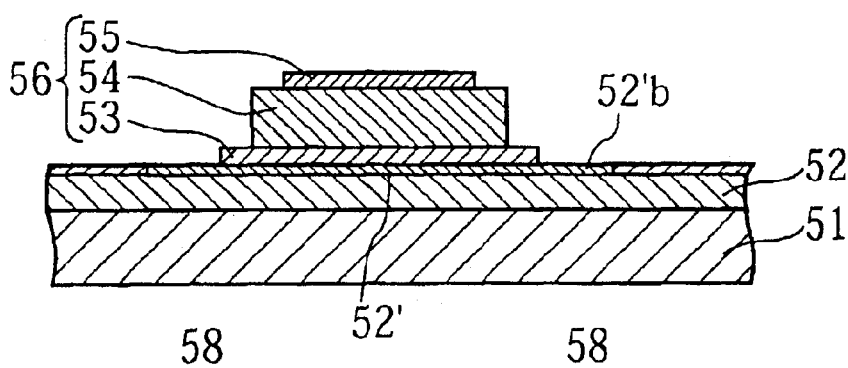
Figure 11D:
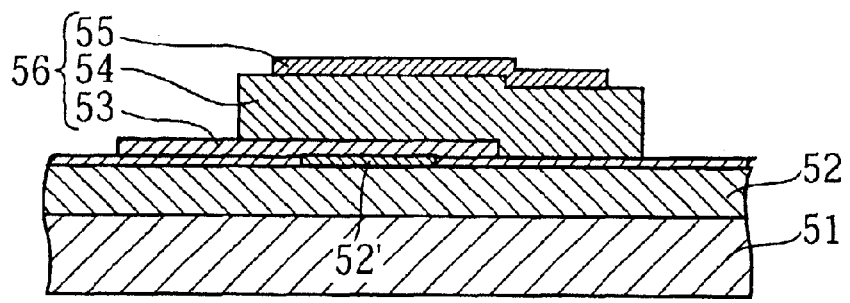

Then, as shown in FIGS. 9D, 10D and 11D, a resonator assembly 56 is formed on the base layer 52. The resonator assembly 56 consists of a first electrode 53, a piezoelectric layer 54 and a second electrode 55. The resonator assembly 56 may be formed through the same steps as the resonator assembly 26 of the second embodiment, though these two assemblies have the following difference. In the second embodiment, as noted above, the first electrode 23 (see FIG. 6D for example) has a stepped portion which reflects the particular fabrication method. In the fifth embodiment, on the other hand, the first electrode 53 is uniformly flat, having no raised or recessed portion.

Figure 10E:
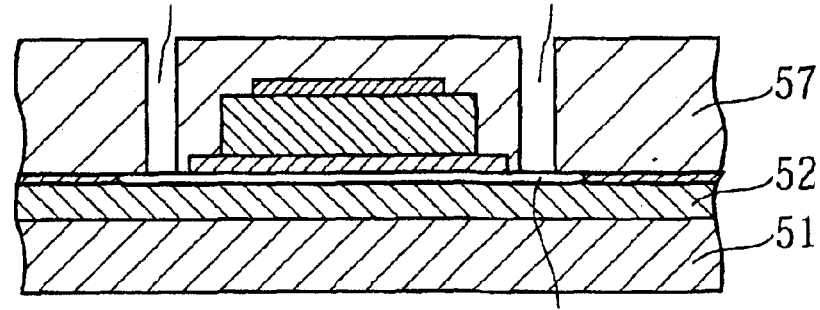
Figure 11E:
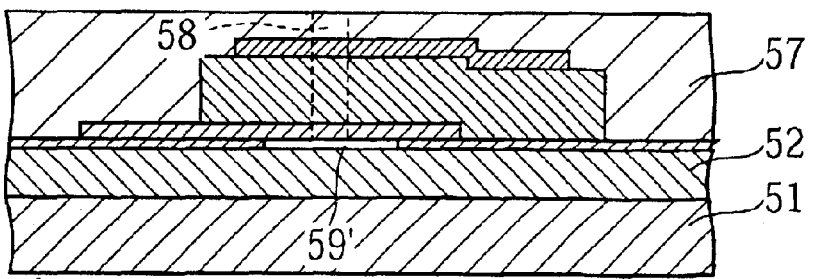

Then, as shown in FIGS. 9E, 10E and 11E, a photoresist 57 is formed to cover the base layer 52, the sacrificial layer 52' and the resonator assembly 56. Through-holes 58 are formed in the photoresist 57 by photolithography, to expose the second islands 52'b of the sacrificial layer 52. Thereafter, acetic acid solution is introduced into the through-holes 58 to work as the etchant for the sacrificial layer 52'. As a result, the sacrificial layer 52'b is etched away, whereby a preliminary space 59' is produced under the resonator assembly 56. At this stage, the base layer 52 (made of silicon dioxide) is not etched away.

After the preliminary space 59' has been formed, hydrofluoric acid buffer solution is introduced into the preliminary space 59' via the through-holes 58. This solution acts on the base layer 52, and eats away the base layer 52 uniformly in the downward direction. Then, when the etching depth becomes 5 µm, the etching process is stopped.

Figure 10F:
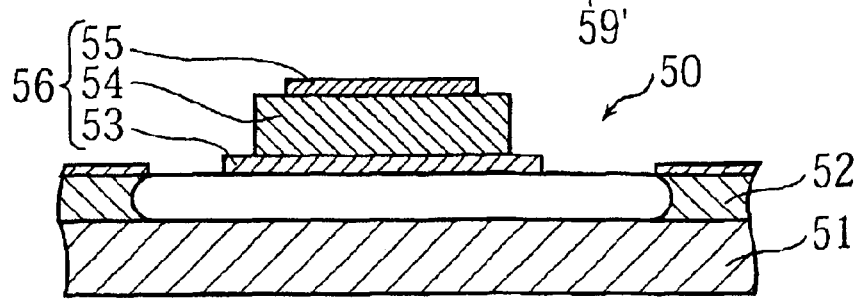
Figure 11F:
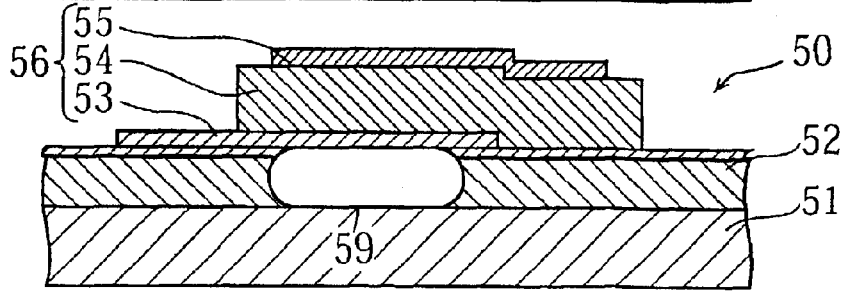

Finally, as shown in FIGS. 9F, 10F and 11F, the photoresist 57 is removed. Thus, the product FBAR 50 is obtained.

According to the above embodiment, as noted above, the first electrode 53 is produced on an entirely flat surface. In this manner, since the first electrode 53 is made flat as a whole, it is possible to reduce the spurious modulation which might otherwise be detrimental to proper operation of the FBAR 50.

In the second to the fifth embodiments described above, the first electrode of the resonator assembly covers only a part of the sacrificial layer (see FIG. 8 for example, where the second islands 42'b of the sacrificial layer 42 are not covered by the first electrode 43). Alternatively, the first electrode may cover the entirety of the sacrificial layer. In this case, to etch away the underlying sacrificial layer, the sacrificial layer needs to be exposed from the first electrode. To this end, an opening may be made in the first electrode by dry etching for example. Then, the exposed portion of the sacrificial layer is brought into contact with the etchant supplied via a through-hole formed in a photoresist.

According to the present invention, there is no need to make a recess or through-hole in the substrate for providing a space under the resonator assembly. This is advantageous to improving the mechanical strength of an FBAR as a whole. Further, differing from the prior art, it is unnecessary to perform a grinding operation for a sacrificial layer filled in a recess formed in a substrate. Advantageously, the omission of the grinding process serves to save the production time and production costs.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A method of making a film bulk acoustic resonator, the method comprising the steps of:

forming a base layer on a substrate;

forming a resonator assembly in contact with the base layer, the resonator assembly including a first electrode, a second electrode and a piezoelectric layer held between the first and the second electrodes, the first electrode being held in contact with the base layer;

forming a resist layer that covers the resonator assembly and the base layer;

forming a through-hole in the resist layer for partially exposing the base layer;

forming a space by removing a portion of the base layer under the resonator assembly by etchant supplied via the through-hole, wherein the space is substantially in contact with the resonator; and removing the resist layer.

2. A method of making a film bulk acoustic resonator, the method comprising the steps of:

forming a base layer on a substrate;

patterning a sacrificial layer on the base layer;

forming a resonator assembly which includes a first electrode, a second electrode and a piezoelectric layer disposed between the first and the second electrodes, the first electrode being held in contact with the sacrificial layer and the base layer;

forming a resist layer covering the resonator assembly, the sacrificial layer and the base layer;

forming a through-hole in the resist layer for exposing a portion of the sacrificial layer;

supplying first etchant via the through-hole for removing the sacrificial layer so as to provide a preliminary space under the resonator assembly;

supplying second etchant via the through-hole for making a main space in the base layer under the resonator assembly, the main space being larger than the preliminary space; and removing the resist layer.

3. The method according to claim 2, wherein the step of forming the through-hole includes exposing a portion of the first electrode via the through-hole and removing the exposed portion of the first electrode to expose the sacrificial layer.

4. The method according to claim 2, further comprising the step of forming an additional layer on the base layer after the sacrificial layer is formed, the additional layer being made to be flush with the sacrificial layer.

5. The method according to claim 2, wherein the sacrificial layer includes a first land, a second land and a connection strip connecting the first land to the second land, the resonator assembly being formed to cover the first land, the through-hole being formed to expose at least a portion of the second land.

6. The method according to claim 2, wherein the sacrificial layer is smaller in thickness than the first electrode.

7. The method according to claim 1, wherein the base layer has a thickness greater than a depth of the space.

8. The method according to claim 2, wherein the base layer has a thickness greater than a depth of the main space.

9. The method according to claim 1 or 2, wherein the base layer has a thickness in a range of 1–50 $\mu$m.

10. The method according to claim 1 or 2, wherein the base layer is made of an insulating material.

11. The method according to claim 10, wherein the insulating material is one selected from a group which includes silicon dioxide, magnesium oxide, zinc oxide, PSG, BSG, BPSG and SOG.

12. The method according to claim 1 or 2, wherein one of the first and the second electrodes is made of a material selected from a group which includes molybdenum, tantalum, tungsten, nickel, niobium, gold, platinum, copper, palladium, aluminum, titanium, chromium, titanium nitride, tantalum nitride, niobium nitride, molybdenum silicide, tantalum silicide, tungsten silicide, niobium silicide and chromium silicide.

13. The method according to claim 1, wherein the etchant is one selected from a group which includes hydrofluoric acid solution, acetic acid solution and phosphoric acid solution.

14. The method according to claim 2, wherein the second etchant is one selected from a group which includes hydrofluoric acid solution, acetic acid solution and phosphoric acid solution.

15. The method according to claim 2, wherein the sacrificial layer is made of one of magnesium oxide and zinc oxide.

16. The method according to claim 2, wherein the first etchant is one of acetic acid solution and phosphoric acid solution.

* * * * *